United States Patent

Sawada et al.

[11] Patent Number: 5,151,406
[45] Date of Patent: Sep. 29, 1992

[54] LAMINATED SUPERCONDUCTOR

[75] Inventors: Kazuo Sawada; Kengo Okura; Noriyuki Yoshida; Satoshi Takano; Kenji Miyazaki; Noriki Hayashi, all of Osaka, Japan

[73] Assignee: Sumitomo Electric Industries, Ltd., Osaka, Japan

[21] Appl. No.: 160,115

[22] Filed: Feb. 25, 1988

[30] Foreign Application Priority Data

Feb. 26, 1987 [JP] Japan ................................. 62-44266
Aug. 24, 1987 [JP] Japan ............................... 62-209932

[51] Int. Cl.⁵ .............................................. B32B 9/00
[52] U.S. Cl. ...................................... 505/1; 505/701; 505/702; 505/704; 505/705; 428/688; 428/457; 428/930
[58] Field of Search ................... 505/1, 701, 702, 704, 505/705; 428/457, 688

[56] References Cited

FOREIGN PATENT DOCUMENTS 207315  1/1987  European Pat. Off. .
1479481 5/1967  France .

OTHER PUBLICATIONS

Amer. Var. Sec Series 3, AIB Cent. Proceedings No. 165 Anaheim 1987 pp. 358ff.
Mat & Processing Report, Jan. 1988, MIT.

Primary Examiner—Patrick J. Ryan
Assistant Examiner—A. Powers
Attorney, Agent, or Firm—Wegner, Cantor, Mueller & Player

[57] ABSTRACT

A laminated ceramic superconductor which comprises at least two layers of ceramic superconductor and a stabilizing metal layer interposed between said ceramic superconductor layers, which has improved flexibility and increased critical current density.

6 Claims, 2 Drawing Sheets

LAMINATED SUPERCONDUCTOR

BACKGROUND OF THE INVENTION

1. Field of the Invention

The present invention relates to a laminated superconductor. More particularly, it relates to a laminated superconductor comprising at least two layers of ceramic superconductor and a stabilizing metal layer interposed between said ceramic superconductor layers, which can be used as a flexible wire for connecting electrical or electric devices or as a conductive wire of a superconducting magnet.

As superconductive materials, metallic, ceramic and organic compound types are known. Among them, the ceramic superconductor such as one having a layer perovskite ($K_2NiF_4$) crystal structure has been found to have a higher critical temperature and is recently very actively studied and developed. For example, an oxide type ceramic superconductor such as $[LaSr]_2CuO_4$ and $[LaBa]_2CuO_4$ has a critical temperature of higher then 30K.

The ceramic superconductor is hard and brittle, and only a very thin film of ceramic superconductor has flexibility. For wiring, the ceramic superconductor should be as thin as about 10 $\mu$m. However, such thin film ceramic superconductor cannot have a large critical current density.

In addition, the ceramic superconductor is very brittle and its processing is not so easy as metal superconductors.

SUMMARY OF THE INVENTION

One object of the present invention is to provide a laminated ceramic superconductor with improved flexibility.

Another object of the present invention is to provide a laminated ceramic superconductor having good processability.

Further object of the present invention is to provide a laminated ceramic superconductor having an increased critical current density.

These and other objects are accomplished by a laminated ceramic superconductor which comprises at least two layers of ceramic superconductor and a stabilizing metal layer interposed between said ceramic superconductor layers.

DETAILED DESCRIPTION OF THE INVENTION

As a ceramic superconductor, any of known ceramic superconductors may be used. Particularly, those having a layer perovskite crystal structure are preferred.

Preferred examples of the ceramic superconductors are those having a composition formula of $$(M^1{}_{1-x}M^2{}_x)_2M^3M^4{}_{4-y} \qquad (I)$$

wherein $M^1$ is an element selected from the lanthanum series elements, $M^2$ is an element selected form the elements of the IM, IIA and IIIB groups, $M^3$ is an element selected from the group consisting of elements of IB, IIB and IIIA groups and transition elements, $M^4$ is an element selected from the group consisting of oxygen, boron, carbon, nitrogen, fluorine and sulfur, x is a number of larger than 0 (zero) and smaller than 1 (one), and y is a number of not smaller than 0 (zero) and smaller than 4. Typical examples of the ceramic superconductor of the formula (I) are $(La_{1-x}Sr_x)_2CuO_4$, $(La_{1-x}Ba_x)_2CuO_4$, $(Y_{1-x}Sr_x)_2CuO_4$ and $(Y_{1-x}Ba_x)_2CuO_4$.

The layer of ceramic superconductor can be formed by ion beam spattering, multi-element vacuum deposition, plasma CVD, plasma spray coating, and a sol-gel method By these methods, the layer of ceramic superconductor is formed on the stabilizing metal layer without strain.

The thickness of ceramic superconductor layer is from 0.1 to 100 $\mu$m, preferably from 1 to 50 $\mu$m.

The stabilizing layer is formed by a conductive metal such as copper, aluminum, silver, gold and the like. The stabilizing metal layer may be supplied in the form of a thin foil or film or formed by any one of the methods which are used for forming the layer of ceramic superconductor The thickness of the stabilizing metal layer is from 10 to 1,000 $\mu$m, preferably from 50 to 800 $\mu$m.

PREFERRED EMBODIMENTS OF THE INVENTION

Example 1

Figure 2:
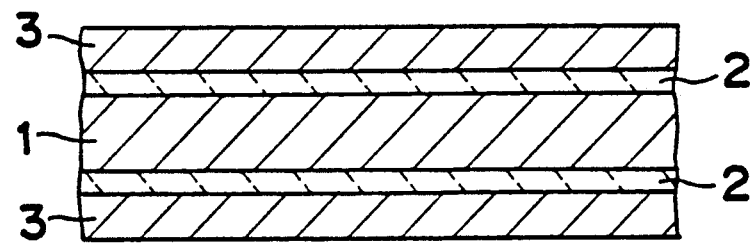
FIG. 2 is a cross sectional view of one embodiment of the laminated ceramic superconductor according to the present invention.

FIG. 2 shows a cross section of one preferred embodiment of a laminated ceramic superconductor in the sheet form according to the present invention, which comprises a copper tape 1 as a center stabilizing layer, two ceramic superconductor layers 2,2 which sandwich the copper tape 1, and two outer stabilizing copper layers 3,3 formed on the outer surfaces of the respective ceramic superconductor layers 2,2.

As the ceramic superconductor, $La_{1.6}Sr_{0.4}CuO_4$ was deposited on both surfaces of the copper tape 1 by sputtering under following conditions:

| | |
|---|---|
| Source materials: | $La_{1.8}Sr_{0.2}Cu_{1.5}O_x$ |
| Apparatus: | RF magnetron sputtering apparatus |
| Conditions: | |
| Substrate temperature: | 550° C. |
| Pressure: | $1 \times 10^{-2}$ Torr |
| | $O_2/(O_2 + Ar) = 10\%$ |
| Time: | 17 hours |

The thickness of each ceramic superconductor layer was 0.01 mm.

On an outer surface of each ceramic superconductor layer, a stabilizing copper layer having a thickness of 0.02 mm was formed by sputtering under following conditions;

| | |
|---|---|
| Apparatus: | DC magnetron sputtering apparatus |
| Conditions: | |
| Temperature: | Room temperature |

| | |
|---|---|
| -continued | |
| Pressure: | $2 \times 10^{-2}$ Torr. |
| DC powder: | 100 Watts |
| Time: | 25 minutes |

The produced laminated ceramic superconductor exhibited superconductivity stably at about 36K.

Example 2

Figure 3:
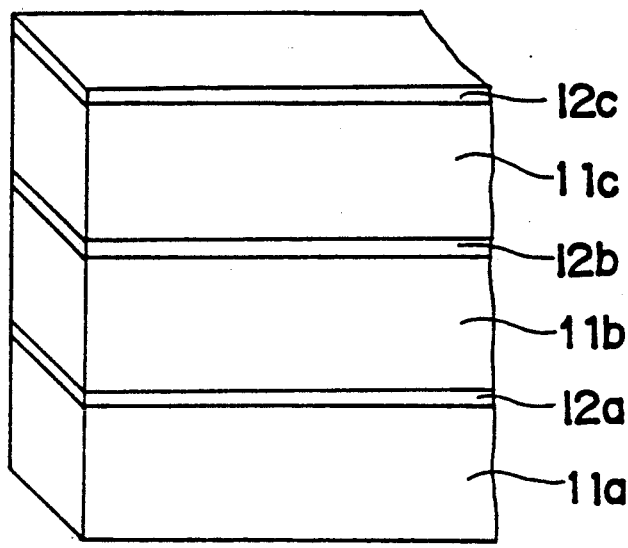
FIG. 3 is a perspective view of another embodiment of the laminated ceramic superconductor according to the present invention.

FIG. 3 shows a perspective view of another preferred embodiment of a sheet form laminated ceramic superconductor according to the present invention, which comprises three ceramic superconductor layers 11a, 11b, 11c each of which is made of a ceramic superconductor having a composition of $YBa_2Cu_3O_{6.8}$ and has a thickness of 10 μm and three stabilizing metal layers 12a, 12b, 12c each of which is made of copper and has a thickness of 100 μm.

The laminated ceramic superconductor of FIG. 3 exhibited critical current of 30 A at 77K.

COMPARATIVE EXAMPLE

Figure 1:
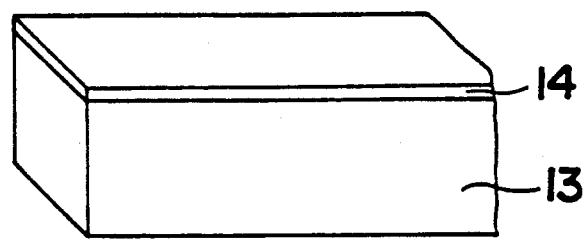
FIG. 1 is a cross sectional view of a conventional laminated ceramic superconductor.

For comparison, a laminated ceramic superconductor having a structure shown in FIG. 1 was produced. Said two layer ceramic superconductor consisted of a ceramic superconductor layer 13 which was made of a ceramic superconductor having a composition of $YBa_2Cu_3O_{6.8}$ and had a thickness of 30 μm and a stabilizing copper layer 14 which had a thickness of 100 μm. The critical current of the comparative laminated ceramic superconductor was 10 A at 77K.

Both the laminated ceramic superconductors of Example 2 and that of Comparative Example could be bent to a radius of curvature of 1 cm without decrease of current capacity.

Figure 4:
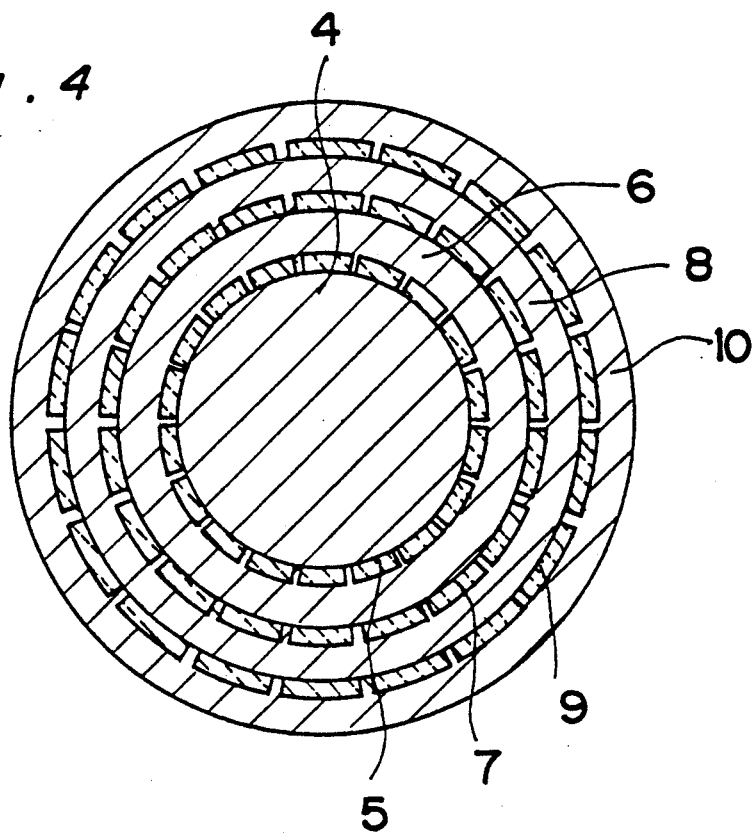
FIG. 4 is a cross sectional view of a further embodiment of the laminated ceramic superconductor according to the present invention.

In addition to the above preferred structures, the laminated ceramic superconductor of the present invention may be in the form of a wire as shown in FIG. 4, which comprises a core conductive metal wire 4 made of for example, aluminum, copper and the like, a ceramic superconductor layer 5, a stabilizing aluminum layer 6, a second super conductor layer 7, a stabilizing layer 8, a third ceramic superconductor layer 9 and a stabilizing layer 10.

We claim:

1. A laminated ceramic superconductor which comprises at least two layers of a ceramic superconductor having a layer perovskite crystal structure and a composition formula of $$YBa_2Cu_3O_{6.8} \text{ or } (M^1_{1-x}M_x^2)_2M^3M^4_{4-y}$$

wherein $M^1$ is an element selected from the lanthanum series of elements $M^2$ is an element selected from the elements of the IA IIA, and IIIB groups, $M^3$ is an element selected from the group consisting of elements of the IB, IIB and IIIA groups and transition elements, $M^4$ is an element selected from the group consisting of oxygen, Boron, carbon, nitrogen, flourine, and sulfur, x is a number larger than zero and smaller than one, and y is a number not smaller than zero and smaller than four; and a stabilizing conductive metal layer, formed from a material selected from the group consisting of copper, aluminum, silver and gold, interposed between said ceramic superconductor layers.

2. The laminated ceramic superconductor according to claim 1, wherein the ceramic superconductor has a composition formula of $$(M^1_{1-x}M^2_x)_2M^3M^4_{4-y} \qquad (I)$$

wherein $M^1$ is an element selected from the lanthanum series elements, $M^2$ is an element selected from the elements of the IA, IIA, and IIIB groups, $M^3$ is an element selected from the group consisting of elements of the IB, IIB and IIIA groups and transition elements, $M^4$ is an element selected from the group consisting of oxygen, boron, carbon, nitrogen, fluorine and sulfur, x is a number of larger than 0 (zero) and smaller than 1 (one), and y is a number not smaller than 0 (zero) and smaller than 4 (four).

3. The laminated ceramic superconductor according to claim 2, wherein the ceramic superconductor has a composition formula of $(La_{1-x}Sr_x)_2CuO_4$, $(La_{1-x}Ba_x)_2CuO_4$, $(Y_{1-x}Sr_x)_2CuO_4$ or $(Y_{1-x}Ba_x)_2CuO_4$.

4. The laminated ceramic superconductor according to claim 1, wherein the stabilizing metal layer is made of copper.

5. The laminated ceramic superconductor according to claim 1, which is a sheet form.

6. The laminated ceramic superconductor according to claim 1, which is a wire form.

* * * * *